(12) United States Patent
Graf

(10) Patent No.: US 6,273,326 B1
(45) Date of Patent: Aug. 14, 2001

(54) METHOD AND DEVICE FOR PRODUCING A METALLIC OR CERAMIC BODY

(76) Inventor: Daniel Graf, Eberdinger Weg 3/2, D-71254 Heimerdingen (DE)

(*) Notice: Subject to any disclaimer, the term of this patent is extended or adjusted under 35 U.S.C. 154(b) by 0 days.

(21) Appl. No.: 09/446,098

(22) PCT Filed: Jul. 10, 1998

(86) PCT No.: PCT/DE98/01977

§ 371 Date: Dec. 15, 1999

§ 102(e) Date: Dec. 15, 1999

(87) PCT Pub. No.: WO99/02342

PCT Pub. Date: Jan. 21, 1999

(30) Foreign Application Priority Data

Jul. 11, 1997 (DE) .............................................. 197 29 770

(51) Int. Cl.[7] .............................. B21D 39/03; B23K 31/02
(52) U.S. Cl. ......................... 228/170; 228/190; 228/254; 156/152; 156/235; 156/239; 264/171.13
(58) Field of Search ..................................... 228/190, 170, 228/177, 254; 29/33 Q, 33 S; 156/152, 231, 233, 235, 237, 241, 247, 248, 272.8; 264/642, 662, 153, 171.13

(56) References Cited

U.S. PATENT DOCUMENTS

| | | | |
|---|---|---|---|
| 5,273,691 | * | 12/1993 | Hull et al. . |
| 5,354,414 | * | 10/1994 | Feygin . |
| 5,393,613 | * | 2/1995 | MacKay . |
| 5,518,060 | * | 5/1996 | Cleary et al. . |
| 5,637,175 | * | 6/1997 | Feygin et al. . |
| 5,730,817 | * | 3/1998 | Feygin et al. . |
| 5,883,357 | * | 4/1999 | Newman et al. . |
| 6,024,003 | * | 2/2000 | Newman et al. . |
| 6,025,110 | * | 2/2000 | Nowak . |
| 6,066,285 | * | 5/2000 | Kumar . |
| 6,084,980 | * | 7/2000 | Nguyen et al. . |

* cited by examiner

*Primary Examiner*—Colleen Cooke
(74) *Attorney, Agent, or Firm*—Gudrun E. Huckett (57) ABSTRACT

In a method for manufacturing a metallic or ceramic body constructed in layers from a real body elements, the a real body elements are cut out of a body material connected to a support material. Subsequently, the a real body elements are sequentially connected to a respective last applied layer of a real body elements of the body to be manufactured by a physical or chemical connecting process. After connection with the last applied layer, the support material is removed from the a real body elements.

16 Claims, 6 Drawing Sheets

METHOD AND DEVICE FOR PRODUCING A METALLIC OR CERAMIC BODY

BACKGROUND OF THE INVENTION

The invention relates to a method for producing a metallic or ceramic body in which the body is built in layers from a real body elements, wherein the a real body elements are first cut and subsequently connected with the last applied layer by a physical or chemical process. The invention also relates to a device for performing the method.

The inventive manufacturing process is intended, in general, for manufacturing any desired metallic or ceramic bodies. A special field of application is the manufacture of tools as well as prototype molds. The purpose of this inventive method lies in the fast manufacture of metal bodies.

A known method for producing metallic bodies of the aforementioned kind envisions the layered building of a body geometry. The building or generation of the desired geometry can be realized by many very thin layers wherein the respective layer forms the contour of the component at this location. A necessary requirement for all known methods of fast tool construction is the presence of a 3D-CAD construction of the desired geometry. With suitable systems or interfaces the 3D-CAD construction is transformed into a layered model. During the transformation, simultaneously thereto or subsequently, a CNC program for controlling respective devices which are to be used for the layered construction is generated.

The currently known methods for (rapid) tool or component manufacture are based on a direct or indirect sintering process.

In the direct metal-laser-sinter process, a four-phase bronze alloy is used which forms a heterogeneous mixture with high and low melting components. The geometry is built in layers. The entire surface of the respective contour layer is scanned by a laser beam. Based on the principle of liquid phase sintering, the absorbed laser energy will melt the low melting phase and will wet the high-melting phase. The latter remains solid and expands via an irreversible crystal structure conversion. Accordingly, a constant volume can be achieved during sintering. After completion of the sintering process, the component has a granular structure which can be closed by infiltration of an epoxy resin.

In indirect metal-laser-sintering process, a low carbon-containing steel alloy is used having a grain structure that is embedded in a plastic layer. The building of the geometry is also carried out in layers. The laser energy will melt the metal powder only in the area of the plastic layer which results in a gluing of the metal particles. The thus resulting blank has only a minimal mechanical strength and is very porous. Subsequently, the blank is infiltrated by a water-soluble polymer binder and is dried in a heating cabinet at 50° C. (for approximately two days). As a last step, a furnace process will follow, wherein the blank is positioned in a graphite crucible. First, the polymer binder is driven out. Subsequently, the oven temperature is increased to 1050° C. The steel powder is slightly melted but does not completely melt. At this point in time, a very porous component is present which is comprised to approximately 60% of steel. The increase of the furnace temperature to 1120° C. melts the copper alloy that has been added to the graphite crucible and the copper alloy will infiltrate the component by capillary action.

A further method employs the path via generation of a stereo lithography model. The SL model has the contour of the tool to be produced. By molding the SL model in a silicone rubber a mold is produced. The thus resulting mold is filled with fine grain metal powder. The metal powder is provided with a polymer binder which cures at low temperatures. After curing of the polymer binder, t he blank is removed from the silicone mold and is then further processed by a furnace process, during which the blank is positioned in a graphite crucible. First the polymer binder is driven out in the furnace. When increasing the furnace temperature, the steel particles will become glued together. Upon further increase of the furnace temperature, a copper alloy is infiltrated into the porous structure.

The above mentioned methods have numerous disadvantages, which affect the manufacturing time, precision, and possible applications of the components.

Tools manufactured by the direct-metal-laser sintering process have initially a relatively minimal mechanical strength because of the high contents of epoxy resins. Accordingly, the behavior of a fully metallic body is not exhibited. This means that it is not possible to produce by this method highly loadable metal prototype parts. In relation to tools, this has primarily an effect with regard to the service life of the tools. Despite the infiltration with epoxy resin, a more or less granular structure of the surface remains. High gloss polishing of the surface is not possible. Moreover, because of the high epoxy component a relatively bad heat conductivity for tools (for example, injection molding tools) is provided. Based on this, when used as a prototype mold, other finishing conditions as in the later mass-produced tools may result which may have an effect on the properties of the produced components (for example, distortion, mechanical properties, etc.). This is primarily of interest for technical functional models. A further disadvantage is that the produced molds/components have only a limited thermal load resistance, i.e., can be used only in thermoplastic injection molding processes or at low temperatures (less than 200° C.). A use for aluminum or zinc die casting is not possible. When producing prototype molds, it must be further taken into consideration that very thin stays, dome structures, and ribs cause problems because of the mechanical strength of the material. Such details must be subsequently introduced by conventional methods. This requires additional time expenditure. A further disadvantage is that the prototype molds/components cannot be post-machined by sinking by EDM (for example, for tool modifications). Moreover, already during tool construction the manufacturing process of sintering must be taken into account. The component manufacture is limited to dimensions (W, L, H) of 250 mm×250×150 mm. It is a further disadvantage in this context that no free material selection is possible. The produced component is comprised of a material mixture. A disadvantage for the manufacture of injection tools is that the core and cavity must be produced separately, i.e., sequentially. Accordingly, the nominal manufacturing time for the complete tool is doubled (i.e., is approximately four to six days). Furthermore, the manufacture of hollow bodies is not possible. The minimally achievable layer thickness is 0.05 mm. Each contour layer must be a really treated by the laser (time expenditure). In indirect metal-laser-sinter processes, the decisive disadvantage lies in the last processing step. During infiltration of the porous steel structure by the copper alloy, shrinkage of the component of up to 4% occurs. This shrinkage makes the tool design more complicated and can result in great imprecisions of the component. Furthermore, an a real machining of each contour layer by the laser is required (time expenditure). The minimally achievable layer thickness is 0.05 mm. A further disadvantage is the complicated and time-consuming manufacturing process. The manufacturing process per component is five to eight days. In this method it is also not possible to manufacture the core and cavity for an injection tool in a single step. Accordingly, the total manufacturing time for the tools when optimized is two to three weeks. The method does not allow manufacture of hollow bodies. The maximum dimensions are 250 mm×250 mm×150 mm. Furthermore, this method is also limited to certain material combinations (steel copper alloy). It is not possible to produce general metal prototypes.

In the disclosed molding process (stereo lithography part/silicone mold), the components to be produced are limited to a size of 100 mm×100 mm×100 mm. It should be noted in this context that for the above dimensions a shrinkage of approximately 0.8% will result. Greater dimensions are not possible with this method because the shrinkage will increase considerably at this value and exhibits a behavior which is non-linear with respect to the dimensions (i.e., it cannot be taken into consideration when designing the tool/component). The method is rather complicated because of the manufacture of a stereo lithography model and the subsequent molding as well as the time-consuming furnace process. The manufacturing time per component is approximately eight to fourteen days. This means that the total time for an injection molding tool is three to four weeks. Furthermore, by using the extra steps of a stereo lithography model, additional imprecision sources are introduced into the manufacturing process. The manufacture of hollow bodies is not possible with this method. Only a certain material combination can be used in this method for the desired parts, i.e., a material mixture of approximately 60% steel and 40% copper is also present. Accordingly, there is no general metal prototype production possible in this context.

A further known method of the aforementioned kind for producing metallic bodies suggests to first cut a real body elements and to subsequently connect the layers to one another by a soldering process. The problem of this manufacturing process is that only thick body elements can be used so that the metallic body accordingly has only a very coarse structure. In order to be able to produce a finely stepped metallic body, the a real body elements must be correspondingly thin. However, this is not possible with the known manufacturing process because such thin body elements cannot be handled.

SUMMARY OF THE INVENTION

Based on this, it is an object of the invention to further develop a method for manufacturing a metallic body of the aforementioned kind so that with this method metallic bodies of high precision, even for minute details, can be produced. Furthermore, a device for performing the method is to be provided.

As a technical solution, it is suggested with the invention in regard to the method that a real body elements are cut from a base material which comprises a support material with coated body material and that the a real body elements after connection to the last applied layer are removed from the support material.

This manufacturing process is especially important for very fine contour dimensions (for example, circles of a diameter of 1 mm) whose fixation during cutting, transporting, and building is very difficult. Accordingly, metallic bodies, especially tools as well as prototype molds can be produced with very great detail precision since with the inventive method a real body elements with very minimal layer thickness of 0.01 to 0.5 mm can be processed. Accordingly, it is possible to provide excellent contour precision. For example, even small radii can still be cleanly reproduced. The basic idea of the inventive manufacturing process is that the a real body element should not be handled by itself but should be placed onto a stable support material which has, for example, a thickness of 0.1 to 1.0 mm and is itself made of metal. The a real body element is thus detachably mounted, essentially temporarily, for the purpose of removal at a later time. This stabilizing support material allows manipulation of the above mentioned very thin real body elements. Furthermore, it is also possible to generate hollow bodies and undercuts in the metallic body. The produced metallic bodies are not comprised of a material mixture, but to more than 90% of a base material, i.e., the material of the real body elements. The support material moreover provides a precise fixation and transport of the generated real body element, including the building of the geometry. Accordingly, tools as well as metal prototype parts can be produced of any suitable metallic material with high precision and speed even for large dimensions and minute details. This entails very high mechanical and thermal loading as well as excellent heat conductivity. With the inventive method bodies are produced that are comprised completely of metal. For producing the components all conventional metal materials can be used (for example, steel, stainless steel, aluminum, copper, brass). Because of the multitude of usable materials, the method is not only suitable for manufacturing prototype molds (or tools) for a thermoplastic injection molding process, for resin processing as well as for aluminum die casting, but also, in general, for producing metallic prototypes as well as complex metallic structures. The presence of a compact metal material ensures excellent heat conductivity. Accordingly, in the prototype mold (for example, for thermoplastic injection molds) machining conditions can be achieved which are very similar to mass production conditions. This is especially of great interest for the manufacture of technical functional models (otherwise, the mechanical properties of the prototype parts could differ from those of the mass produced parts). A further advantage is that the produced tools have a high thermal load resistance. Accordingly, the method for producing prototype molds can be used for thermoplastic injection molding as well as for resin processing as well as for aluminum die casting, zinc die casting and other metal casting methods. Because of the free material selection as well as the production of fully metallic bodies, a very high mechanical loadability of the tool/component for the respective application is provided. A high service life can thus be achieved for injection molds. The resulting tools can be used past the prototype state also for pre-mass production and mass production. Because of this, considerable cost savings for the construction of mass production tools can be achieved. Over the total development of a product, however, the elimination of the construction time for the mass production tool results in considerable time savings and shortening of the development time. During manufacture no shrinkage occurs that would have to be taken into consideration when designing the tool. Accordingly, the generation and processing of CAD data is simplified and the precision of the component is significantly improved. The manufacturing process is simple and fast. Core and cavity of a tool can be produced in a single working step. Accordingly, the nominal manufacturing time is cut in half in comparison to the aforementioned methods. The manufacturing time, even for large tools (for example, 600 mm×400 mm×200 mm), is one day, with a maximum of two days. For small to medium-sized tools (250 mm×250 mm×150 mm), the manufacture is possible within a few hours (three to ten hours). It is possible to realize without problems large tool dimensions (1000 mm×1000 mm×500 mm and larger). For smaller tools it is also possible to produce with one device a plurality of tools simultaneously. The devices operate fully automatically. Accordingly, a daily use of 24 hours is possible. When subsequent changes at the components or tools are necessary, all conventional metal processing methods can be employed (for example, drilling, milling, cutting, grinding, EMD processes, etc.). For producing the tools and components, as has been mentioned above, it is possible to work with very minimal layer thickness (0.01 mm to 0.05 mm). This allows production of a very precise contour (it is possible, for example, to reproduce even very small radii with clean lines).

A preferred method sequence suggests that the real body element is fastened with a first soldering layer onto the support material and that a second soldering layer is applied to its surface. The second soldering layer has a higher melting point relative to the first soldering layer. Subsequently, to achieve the physical connecting process, the real body element with its second soldering layer is first brought into contact with the last applied layer of the body and the second soldering layer is heated above the melting temperature. Finally, cooling to a temperature between the melting temperature of the second soldering layer and the melting temperature of the first soldering layer is performed, and the real body element is removed from the support material. The basic idea of this preferred development resides in a four-layer system wherein the first soldering layer provides a fixed connection of the real body element to the metallic body produced up to this point, while the second lower melting soldering layer only has the function of fixating the real body element at the support material for the cutting process and transport. The low melting solder material can be bronze, and the high melting solder material can be, for example, copper. By heating the system to a point above the melting temperature of the first soldering layer, the conditions are provided so that the real body element to be fastened can achieve a fixed connection with the body. The cooling to an intermediate temperature range between the two melting temperatures hardens this high melting soldering layer so that the connection between the real body element and the body is so strong that the thus fastened real body element can be removed from the support material. Since the soldering layer has a composition that is very similar to that of the metallic body elements, the degree of "contamination" is minimal.

As an alternative to the afore described soldering method it is suggested that the real body element is fastened with at least one first component of a multi-component adhesive to the support material, that its surface is provided with at least one further second component of the multi-component adhesive, and that for the chemical connecting process the surface of the real body element with its component or components of the multi-component adhesive is brought into contact with the first component or components of the multi-component adhesive adhering to the previously applied layer. Subsequently, the components react chemically with one another to form a fixed connection, and finally the real body element is removed from the support material. This embodiment also deals with a multi-layer system, especially a four-layer system in which as a multi-component adhesive, for example, an epoxy resin can be used. This is a low cost method. Since the afore described method, because of the soldering process, requires a relatively high machine and process-technological expenditure and since, furthermore, by this process steel molds with mechanical properties of a mass-produced mold can be produced, the first alternative is complex and therefore more expensive than the simplified and thus less expensive method. The basic idea is that the individual layers can be connected by gluing. The gluing process is preferably performed at an increased temperature. This temperature is considerably below the soldering temperatures so that the process expenditure is substantially reduced. The bodies produced by the gluing process generally serve as prototype molds because they have minimal mechanical properties. The achievable strength, however, allows production of several multiple hundreds or thousands of parts in the prototype tool by injection. The two adhesive components in the initial state have a certain tackiness so that the real body element can be connected by the first component relatively securely to the support material. The actual adhesive connection, however, is only produced when the first component comes into contact with the second component. By removal from the support material, the underside of the already built geometry has connected thereto the first adhesive component as a remainder. By pressing a new layer having at its upper side the second component against it, a chemical reaction of the two components can occur so that a fixed connection between the already existing geometry and a new layer is realized. This makes it possible to remove the just applied layer from the support material because the chemically reacted adhesive components have a substantially higher strength than the first component. The entire process is supported by an increased temperature which, however, is only effective during certain periods of time, i.e., during the reaction process of the two components as well as for removal of the foils from the support material. The increased temperature reduces the tackiness of the first component at the support material so that the release of the real body element from the support material is facilitated. With the increased temperature the adhesive reaction, i.e., the curing process, is accelerated. The temperature application can be realized by a heatable plate (table) which is activated only part of the time. The same type of temperature application can also be performed in the aforementioned soldering process.

As mentioned before, an advantageous further development of this second alternative of the method sequence is that additional heat is provided. The advantages have already been mentioned above.

A further development suggests that the body is comprised of real body elements having different thickness. Homogenous areas of greater thickness can be provided, depending on the contour, which saves a great amount of time. Areas with great contour changes on the other hand, are produced with very thin layers for reproducing the contour.

Preferably, the real body elements are cut out by a laser. Such laser engraving is a simple possibility for cutting the body elements. Because of the machine-technological conditions of the laser technology a very high geometric precision can be achieved. Even filigree geometric details can be sensed and reproduced, for example, thin ribs, domes as well as stays. With respect to the mechanical strength such details present no problem. The laser engraving produces the respective contour of the required geometrical layer in the base material. The engraving depth extends into the support material, i.e., the total depth is approximately 60 to 70 $\mu$m. This ensures clean separation. For achieving a machining speed with the laser that is as high as possible, a double or multiple laser use is expedient. The first laser, for example, engraves the core contour. Subsequently, the band is moved by a certain path length in the forward direction. The cavity contour is then produced by a second laser while the first laser already produces the next core contour. When using several lasers, the machining speed can be further increased. The sequential or parallel arrangement of several layers can produce an increase of the machining speed as well as provide machining of several work pieces simultaneously.

A further improvement of the inventive manufacturing process suggests that, at the beginning of manufacture of the body or of a contour change of the body parallel to the last applied body element, in a first step the second following real body element is cut out of the base material and that subsequently onto this base material a further body material with connecting material applied to the upper side is applied and from this the first real body element is cut. The basic problem is that the first required contour layer cannot be directly introduced into the base material because no pattern stamp (component, core, cavity) is present which has the required geometric information for receiving the engraved contour layer on the base material. In more simple words, the imprint surface for the body projects past the circumferential contour of the first real body element and would thus produce an undesirable connection with the body material external to the engraved real body element. For realizing this first real body element, a separate base material can be used which is comprised only of the body material as well as, for example, a high-melting soldering material as the connecting material. The laser initially solders the additional strip with matching contour onto the main strip, i.e., the base material, for fixation since prior to this the main strip has been engraved accordingly. Subsequently, the first contour layer is cut from the (auxiliary) band. With this process, the main strip in the area of the desired contour projects past the contour and can be removed from a planar plate from the support material. Accordingly, before the first contour layer is applied by the (auxiliary) band onto the (main) strip, the second contour layer is provided within the (main) strip. This process is required in order to allow the removal of the first two layers from the support material. Furthermore, the application of the first real body element requires the use of this technology always in situations when a contour change parallel to the plane of the last applied layer is needed, since, as explained above, for such a contour change the required imprint information at the stamp is not yet present.

An alternative, or additional, development for solving the afore described problems suggests that the body material adjacent to the cut is partially or entirely removed at the surface area. This takes into account a contour jump by 90° as well as the required widening of the engraving gap depending on the geometric gradient of the body to be produced. In this context there is also the problem that the removal of the desired foil segments from the support material is not possible because the cross-section of the already produced body with respect to its real overlap area upon pressing is too great. By performing a surface removal, the already produced body will not come into contact with the (removed) surface area. The overlap area can be removed by so-called wobbling with a laser beam. This realizes the connection with the exclusively required locations of the foil of the real body element. The same problem of a contour jump also occurs for certain geometric gradients. Since the engraved gap is relatively narrow, it is necessary to widen the engraved gap from a certain contour angle on. In order to be able to manufacture as economically as possible, the engraved gap widening is limited to an amount that depends on the contour. This engraved gap widening can also be produced by wobbling. The width of the engraved gap is thus produced as a function of the contour angle in order to produce only a minimal width sufficient to produce a clean geometric construction and to avoid unnecessary overlap.

A further embodiment of the inventive manufacturing process suggests that the base material is embodied as a strip material to be wound from a supply roll.

Alternatively, the base material can also be embodied as an individual plate whereby with regard to the step sequence nothing changes. The supply of the base material as a sheet material has the advantages that a material change can be performed quickly and simply and that different layer thicknesses for building the geometry can be used. The plates are secured during laser processing by a lateral fixation. The transport of the plates is realized by a roller system. The rollers are lowered for machining of the plates into the table so that a planar or flat support of the plate is provided. During the soldering process a lateral fixation of the plates is provided also. The plates can be supplied from a magazine to the device and after machining can be removed by a gripper system.

As a technical solution for the device it is suggested with the invention to provide a cutting station for cutting the real body element as well as a fastening station arranged downstream for permanent attachment of the cut real body element to the last applied layer of the body.

This provides in a technically simple manner the possibility to technically realize the inventive method. In a first step the real body element to be applied is cut in the cutting station. Subsequently, it is moved to the fastening station arranged downstream in which the attachment occurs.

Preferably, the two stations are connected by a common transport system. This may be a belt system.

A further embodiment suggests that the cutting station comprises an auxiliary band device for the first real body element. This auxiliary band device can be moved in and out as needed. A further development suggests that the fastening station comprises a support table for the real body elements to be fastened as well as a support for the body. The support table and the support can be moved relative to one another. This provides a technically simple realization for pressing the real body element to be fastened onto the already produced body.

Finally, it is suggested in a further embodiment that the fastening station has a heating device arranged thereat. This may be in the form of a soldering furnace. In the soldering furnace a certain basic temperature is present which is below the melting temperature of the low-melting solder material. For performing the actual soldering process the table is preferably electrically heatable and can thus reach within a very short period of time the melting temperature of the high-melting soldering material.

BRIEF DESCRIPTION OF THE DRAWINGS

One embodiment of the inventive device for manufacturing a metallic body is described in the following with the aid of the drawings. It is shown in.

DESCRIPTION OF PREFERRED EMBODIMENTS

Figure 1:
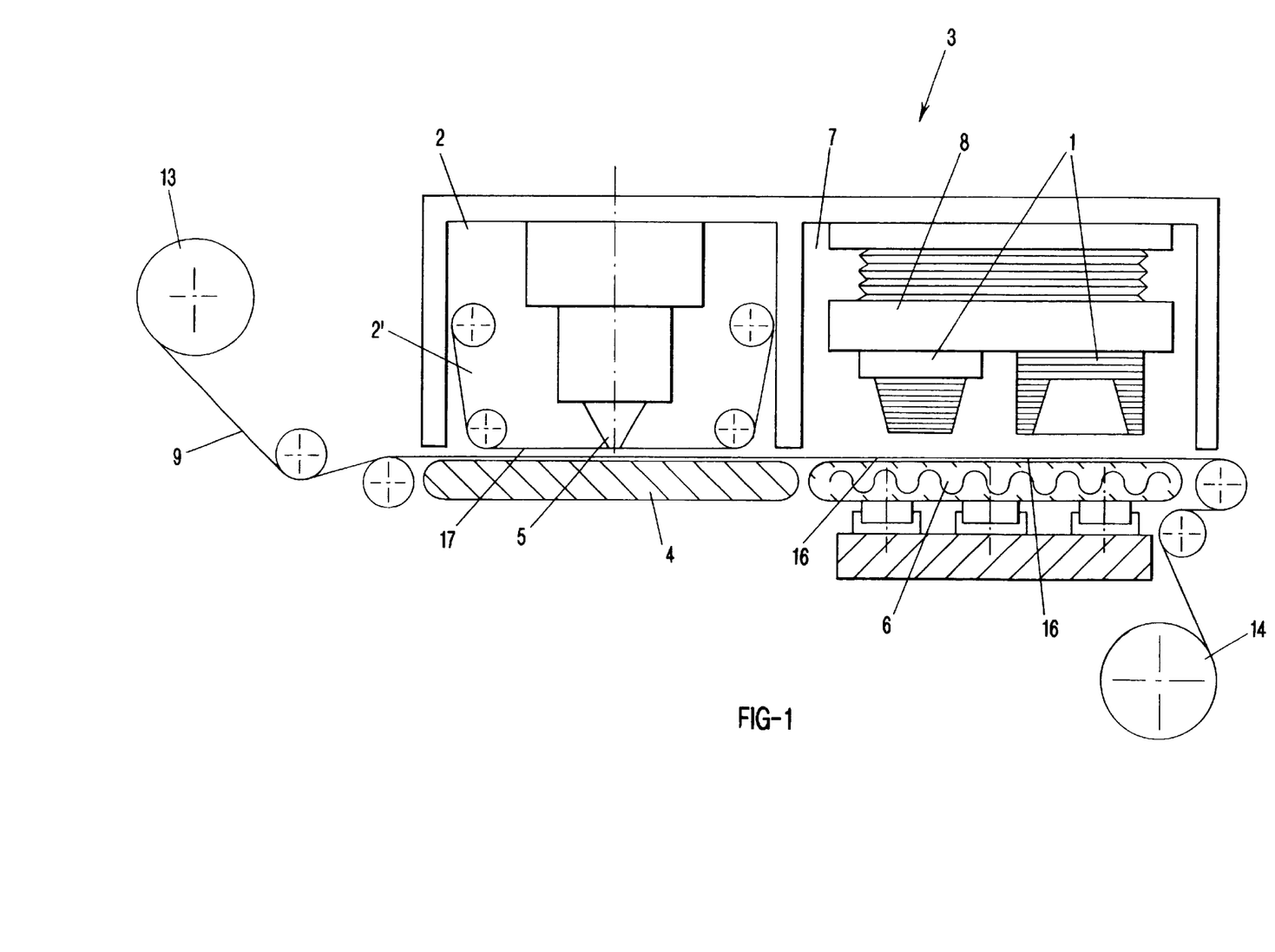
FIG. 1 a schematic side view of the device.

The device for producing any desired metallic body 1 is comprised of a cutting station 2 and a fastening station 3 arranged downstream. The cutting station has arranged thereat an auxiliary strip device 2' which can be moved in and out of the cutting station 2 as needed.

The cutting station comprises a support table 4 as well as a laser engraving device 5.

The fastening station 3 has also a heatable support table 6 that is also height-adjustable. A soldering furnace 7 is arranged above in which a height-adjustable support for the metallic body 1 to be produced is arranged.

Figure 2:
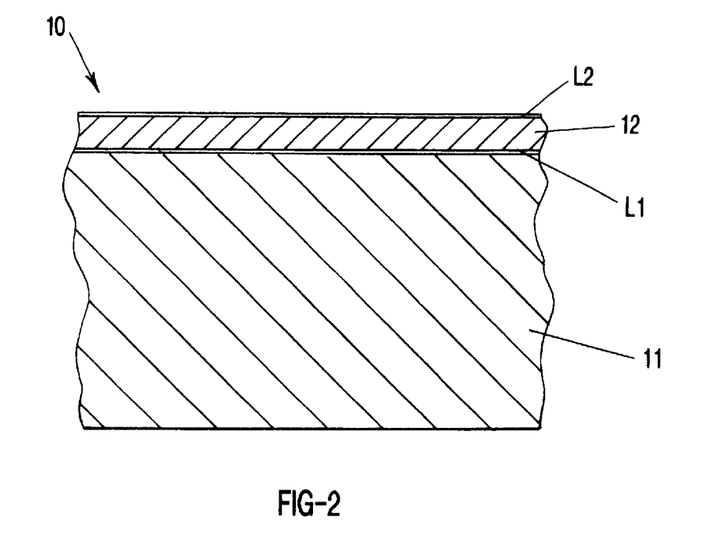
FIG. 2 a section of the base material in the initial state.

A strip or band 9 of a base material 10 is correlated with the device which is shown in more detail in FIG. 2. This base material 10 comprises a support material 11 of a metal band having a thickness of 0.1 to 1.0 mm. With a first low-melting soldering layer L1 a metallic body material 12 of a thickness of 0.01 to 0.05 mm is attached thereto. A second high-melting soldering layer L2 is applied to the body material 12. The soldering layer L1 can be comprised of bronze and the soldering layer L2 of copper while the metal for the body material 12 is the metal of which the metallic body 1 is to be produced.

The manufacturing process for the metallic body 1 functions as follows.

Figure 3:
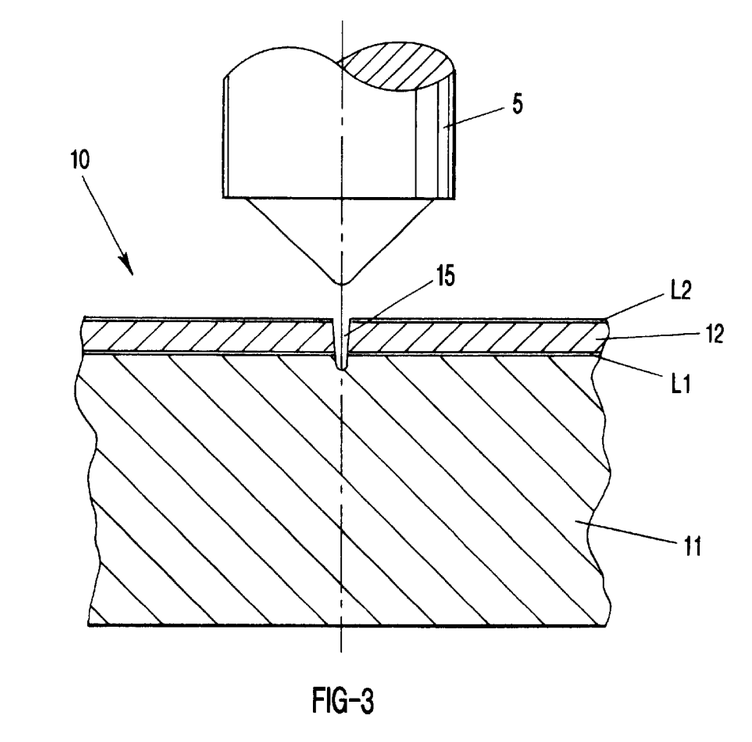
FIG. 3 a representation according to FIG. 2 including the laser engraving process.

The band 9 is wound onto a supply roll 13, is guided past guide rollers through the device and at the end the band is rewound onto a further roll 13. The band 9 first is passed through the cutting station 2. When a portion of the metallic body 1 has already been produced, the auxiliary strip device 2' is moved out of the device. The respective contour of the required geometric layer is engraved into the base material 10 by the laser engraving device 5. This is represented in FIG. 3. The engraving depth extends into the support material 11, i.e., has a total depth of approximately 60 to 70 $\mu$m. This provides for a clean separation of the body material 12. The cut 15 of the engraved line delimits the respectively required thin and real body element 16.

After the engraving process the band 9 is transported farther so that the body element 16 will become positioned within the fastening station 3. Here the construction of the actual geometry with a subsequent soldering process takes place. The basic principle is that the construction and generation of the geometry is realized by several very thin layers by means of the body elements 16 wherein each the layer respectively forms the contour of the component at this location. The fixation of the layers allows realization of filigree contour dimensions, for example, circles of a diameter of 1 mm. The band 9 is positioned precisely beneath the printing stamp of the support 8. For the exact positioning of the band 9 beneath the printing stamp, a travel sensor is arranged laterally at the band 9 which controls the process and monitors it.

After positioning, the band 9 with the cut-out body element 16 is positioned on a vertically movable support table 6 within the soldering furnace 7. In the soldering furnace a certain basic temperature is present which is below the melting temperature of the low-melting soldering material L1. For performing the actual soldering process, the support table 6 is electrically heatable and can thus reach within a very short period of time the melting temperature of the high-melting soldering material L2.

The support table 6 is moved upwardly and the support 8 is moved downwardly so that the body elements 16 are pressed against the already produced metallic body 1. Subsequently, electrical heating of the support table 6 is carried out which results in a heating of the base material to the melting temperature of the high-melting soldering material L2. Accordingly, the soldering process between the engraved body element 16 and the metallic body 1 takes place in which, because of the applied real pressure, possibly present excess soldering material can be forced out of the connecting location. Subsequently, a directed cooling process takes place in which the support table 6, shortly before reaching the solidification temperature of the low-melting soldering material L1 is moved downwardly, respectively, the support 8 is moved upwardly. The high-melting soldering layer L2 at this point in time is already solidified and has produced a fixed connection to the metallic body 1. The downward movement of the support table 6 and the upward movement of the support 8 removes the support material 11 at the low-melting soldering layer L1 from the body element 16. The support material 11 is laterally guided at the table so that a clean removal of the layer is possible. The removal process is further enhanced by gravity.

The first required body element 16 cannot be introduced directly into the base material 10 because no imprint stamp (component, core, cavity) is present which could provide the required geometric information for receiving the engraved contour layer from the base material 10. For producing this first body element 16, the auxiliary band device 2' is used which is horizontally moved into the device for producing the first layer. The band 17 used therein is comprised of a body material 12 and a high-melting soldering layer. The band 17 is first soldered for fixation according to the desired contour onto the band 9 and, subsequently, the first body element 16 is cut out of the band 17. With this process, the band 9 in the area of the desired contour will have a raised portion and can be received on a planar plate of the support 8. However, before the first contour layer is applied onto the band 9 by the band 17, the band 9 first is provided with a second contour layer. This process is required in order to allow the removal of the first two layers from the support material 11.

Figure 9:
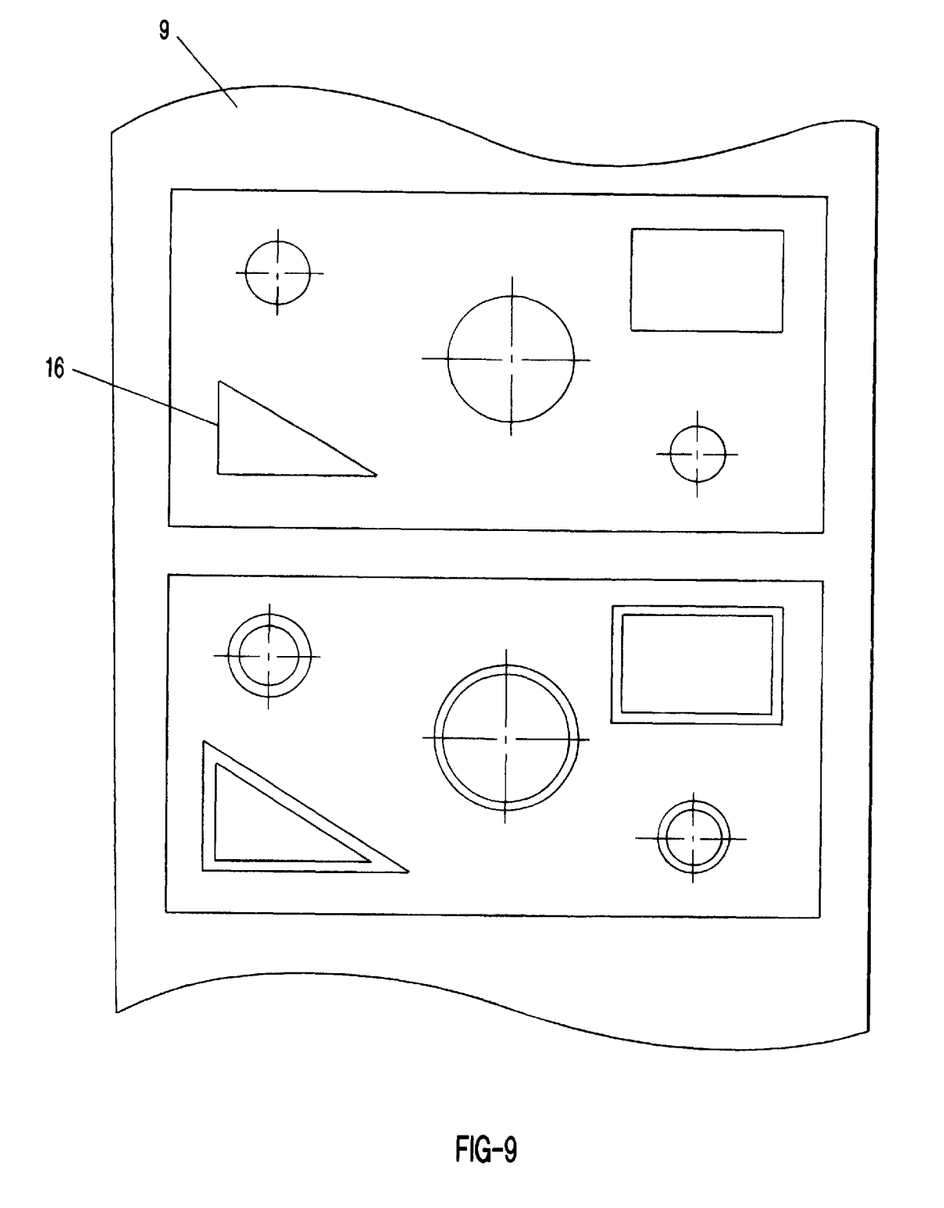
FIG. 9 a plan view onto a processed foil for illustrating a multi-laser use.

The use of this auxiliary band device 2' is always required for a contour change which extends parallel to the support 8 because for such a contour change the required imprint information is not present at the stamp. For reaching a processing speed as high as possible by the laser, a multi-laser use is preferred which is illustrated in FIG. 9. For example, the first laser will engrave the core contour into the band. Subsequently, the band is moved by a respective travel length. The cavity contour is then introduced by the second laser (in FIG. 9 at the lower end) while the first laser already produces the next contour. By using several lasers, the processing speed can thus be further improved.

Figure 4:
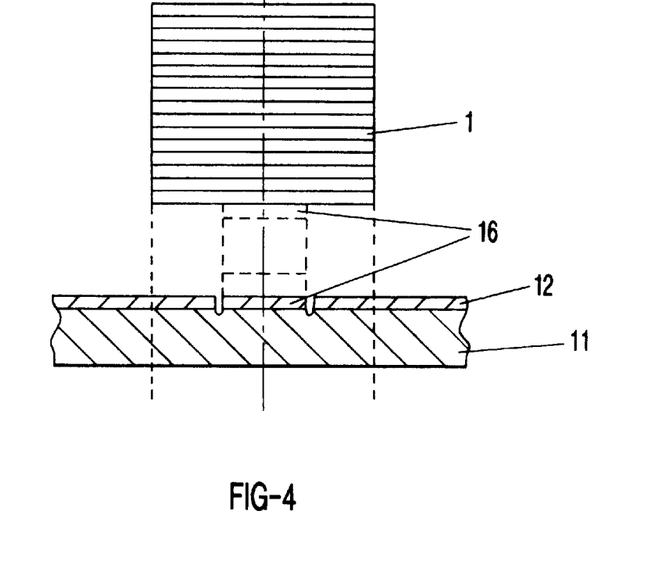
FIG. 4 a representation corresponding to that of FIGS. 2 and 3 in the area of a cut-out body element with an already produced body positioned thereabove.
Figure 5:
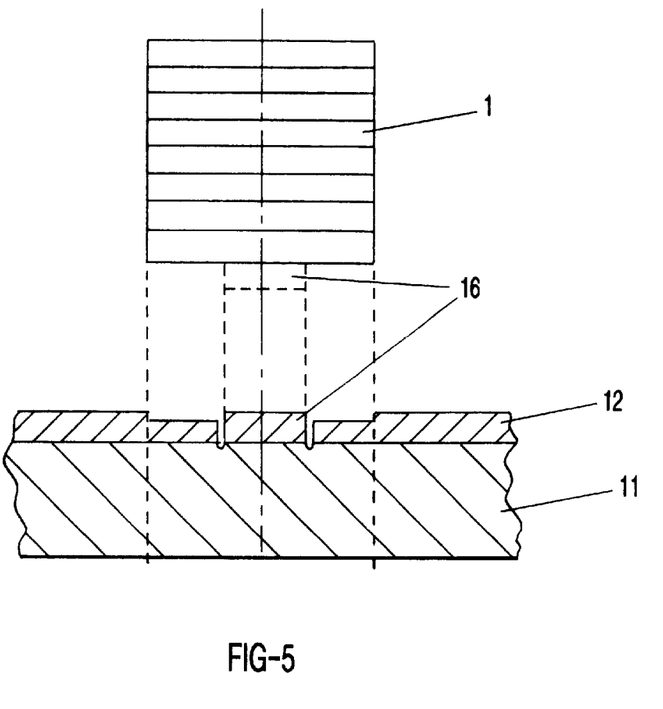
FIG. 5 a representation according to that in FIG. 4 but with partially removed top side of the body material.

In the embodiment of FIGS. 4 and 5 there is the problem that as a further layer of body element 16 must be fastened which relative This would mean that the lowermost layer of the body 1, after respective engraving, would project past the point of interception of the body element 16 and would thus be soldered during the soldering process to this undesirable outer area. For this reason, the surface of the body material 12 is removed by laser treatment in this area. This is shown in FIG. 5.

Figure 6:
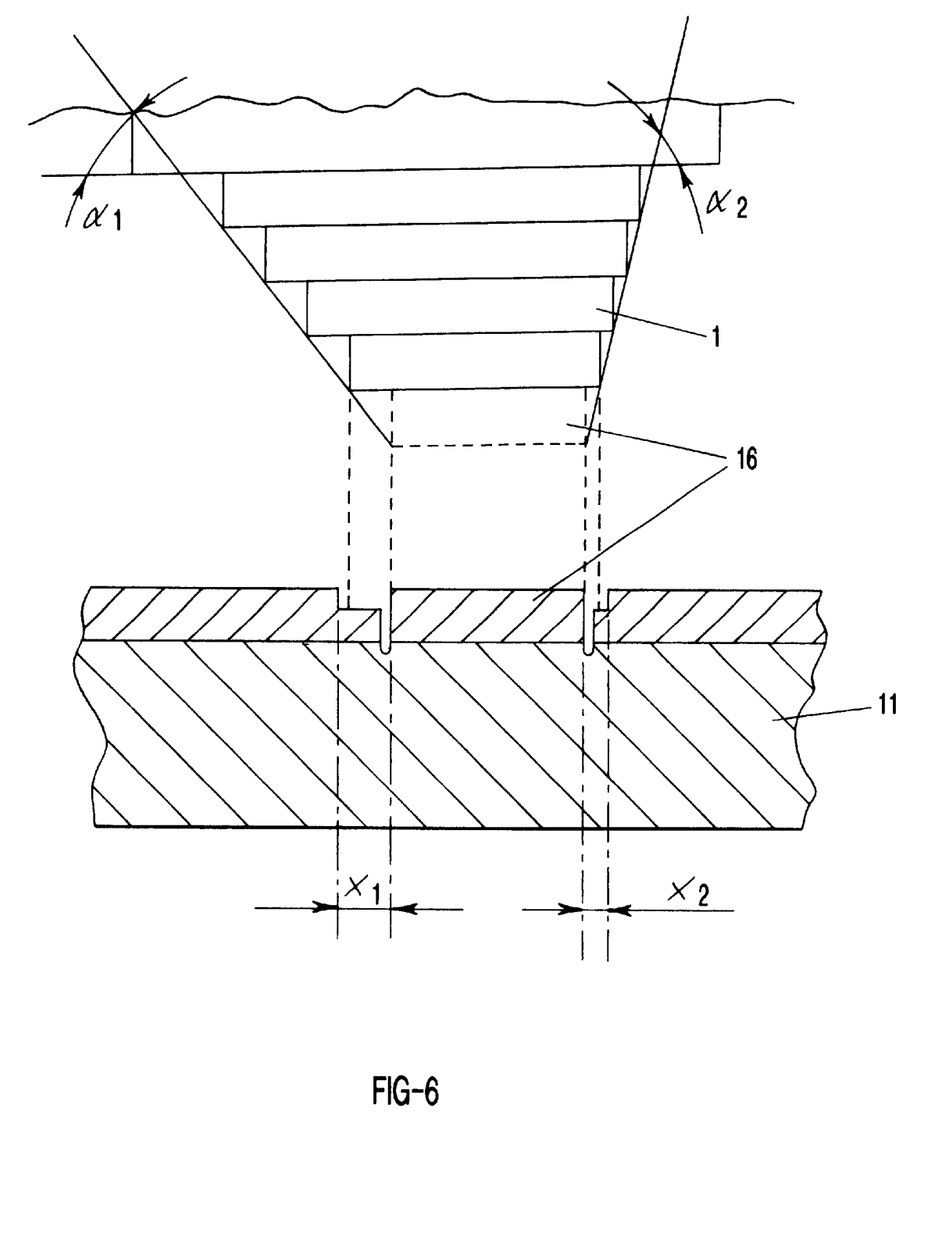
FIG. 6 a representation according to that in FIG. 4 but with an already produced body having a somewhat different shape.

A similar problem is represented in FIG. 6. Due to the angle gradient of the metallic body 1, an overlap with the external area of the body material 12 would occur. In this scenario, a removal of the body material 12 according to the angle gradient is also performed.

Figure 7:
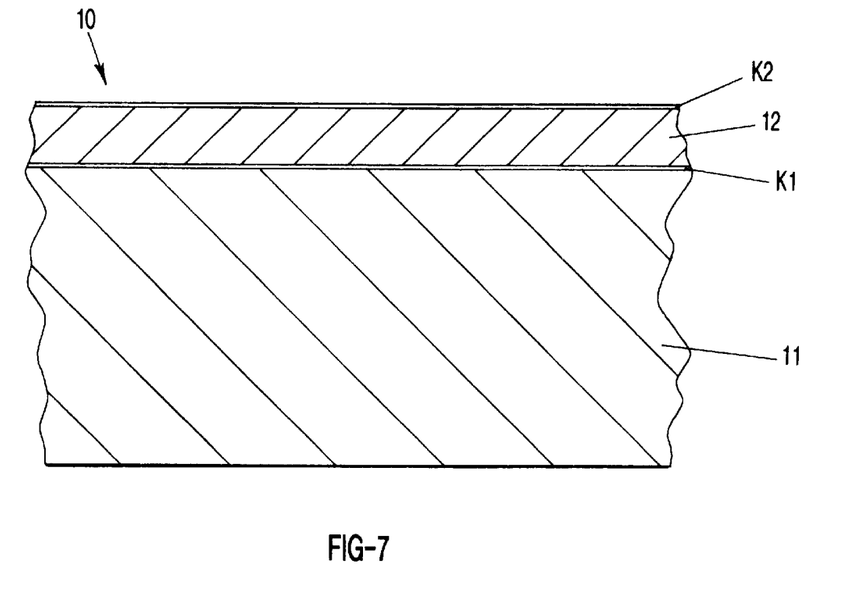
FIG. 7 a representation according to FIG. 2 but with components of a two-component adhesive.
Figure 8:
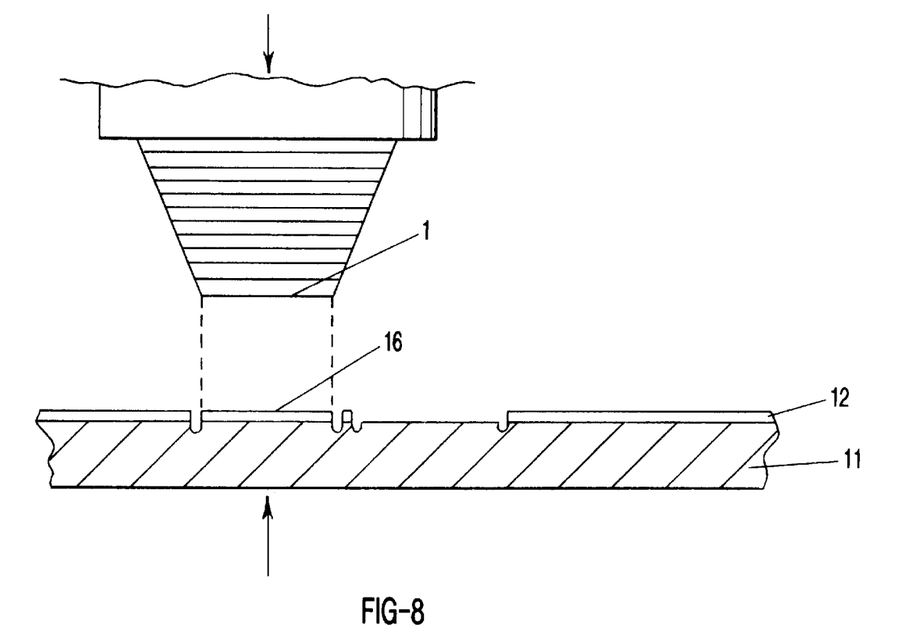
FIG. 8 a representation based on the representation of FIG. 7 during fastening of a foil by the two-component adhesive.

The embodiment in FIGS. 7 and 8 represents an alternative to the soldering process. Instead of the two soldering layers L1 and L2, the two components K1 and K2 of a two-component adhesive are provided. The two adhesive components K1, K2 have in their initial state a certain tackiness so that the body material 12 can be connected by the component K1 relatively securely with the support material 11. The actual adhesive connection, however, is achieved when the component K1 comes into contact with the component K2. By pressing a new layer, having at its upper side the component K2, a chemical reaction of the two components can occur (by removal of the support material lithe adhesive component K1 is present at the underside of the already constructed geometry) so that a fixed connection between the already existing geometry and a new layer is produced. Accordingly, a removal of the support material 11 is possible because the chemically reacted adhesive components K1, K2 have a substantially greater strength than the adhesive component K1. The entire process is improved by increased temperature which, however, is applied only over certain periods of time, i.e., during the reaction process of the two adhesive components K1 and K2 as well as for removal of the body element 16 from the support material 11. The increased temperature reduces the adhesive tendency of the component K1 so that the removal from the support material 11 is facilitated. The increased temperature furthermore accelerates the adhesive action (curing process). The temperature application can be provided similar to that in the soldering process by a heatable plate (table) which is activated only part of the time.

Finally, a device concept should be mentioned which is not represented in the drawings. A second band device is used that is similar to the small band device of the auxiliary band device 2' for producing the first contour layer. The metal foil is coated on both sides with a soldering material (high and low melting). The support material is supplied as a single layer band. The contour layers are first soldered by the laser onto the support material and thus fixated in their position, are subsequently cut, and then transported by the support band into the soldering furnace where they are used in the geometry construction.

The present invention is, of course, in no way restricted to the specific disclosure of the specification and drawings, but also encompasses any modifications within the scope of the appended claims.

What I claim is:

1. Method for manufacturing a metallic or ceramic body (1) said method comprising the steps of:

providing a multi-layer base material (10) comprised of a support material (11), a body material (12), an intermediate layer (L1, K1) positioned between the support material (11) and the body material (12) and configured to temporarily connect the body material (12) to the support material (11), wherein the body material (12) has an upper side opposite the intermediate layer (L1, K1) and wherein the upper side has a coating (L2, K2);

cutting real body elements (16) out of the body material (12) connected to the support material (11);

constructing the metallic or ceramic body (1) by sequentially layering the real body elements (16) and connecting, respectively, an real body element (16) presently being layered to an real body element (16) layered last by a physical or chemical connection effected by the coating (L2, K2) of the real body element presently being layered;

after the step of connecting, separating, respectively, the support material (11) from the real body element (16) presently being layered by detaching the intermediate layer (L1, K1).

2. Method according to claim 1, wherein the intermediate layer is a first soldering layer (L1) and wherein the coating is a second soldering layer (L2), wherein the second soldering layer (L2) is higher melting than the first soldering layer (L1), wherein, for effecting the physical connection, the method comprises the steps of:

contacting the second soldering layer (L2) of the real body element (16) presently being layered with the real body element (16) layered last;

heating the second soldering layer (L2) to a temperature above the melting temperature of the second soldering layer (L2);

subsequently cooling the second soldering layer (L2) to a temperature between the melting temperature of the second soldering layer (L2) and the melting temperature of the first soldering layer (L1) so that the second soldering layer (L2) solidifies and forms the physical connection.

3. Method according to claim 1, wherein the intermediate layer (K1) is at least one first component (K1) of a multi-component adhesive and wherein the coating is at least one second component (K2) of the multi-component adhesive, wherein in the step of separating the at least one first component (K1) adheres to the areal body element (16), wherein, for effecting the chemical connection, the method comprises the step of:

contacting the at least one second component (K2) of the areal body element (16) presently being layered with the at least one first component (K1) of the areal body element (16) layered last so that the first and second components (K1, K2) chemically react with one another to form a fixed chemical connection.

4. Method according to claim 3, wherein heat is applied during the step of contacting and during the step of separating the support material (11) from the areal body element (16).

5. Method according to claim 1, wherein areal body elements (16) of different thicknesses are used for producing the body (1).

6. Method according to claim 1, wherein the areal body elements (16) are cut by a laser.

7. Method according to claim 1, comprising at the beginning of the manufacturing process of the body (1) the steps of:

cutting first a second areal body element (16) to be layered as a second layer for constructing the body (1) out of the body material (12) of the base material (10); and, subsequently, connecting a further layer of body material (12), having a connecting material applied to an upper side thereof, to the body material (12) of the base material (10) and then cutting a first areal body element (16) to be layered as a first layer of the body (1) out of the further layer of base material (10).

8. Method according to claim 1, wherein the body material (12) adjacent to the cut (15) defining the areal body element (16) is partially or entirely removed.

9. Method according to claim 1, wherein the base material (10) is a band removable from a supply roll (13).

10. Method according to claim 1, wherein the base material (10) is an individual plate.

11. Device for performing the method according to claim 1, comprising a cutting station (2) for cutting the areal body element (16) and a fastening station (3) arranged downstream of the cutting station (2) for permanent attachment of the cut areal body element (16) to the areal body element of the body (1) layered last.

12. Device according to claim 11, comprising a common transport system connecting the cutting station (2) and the fastening station (3).

13. Device according to claim 11, wherein the cutting station (2) comprises an auxiliary cutting station (2') configured to cut a first areal body element for constructing the metallic or ceramic body (1).

14. Device according to claim 11, wherein the fastening station (3) has a support table (6) for the areal body element (16) and a support (8) for the body (1), wherein the support table (6) and the support (8) can be moved relative to one another.

15. Device according to claim 11, wherein the fastening station (3) has a heating device.

16. Method according to claim 1, comprising, for a contour change of the body (1) in a direction parallel to the body element (16) layered last, the steps of:

cutting first a second areal body element (16) to be layered as a second layer of the contour change of the body (1) out of the body material (12) of the base material (10); and, subsequently, connecting a further layer comprised of body material (12), having a connecting material applied to an upper side thereof, to the body material (12) of the base material (10) and then cutting a first areal body element (16) to be layered as a first layer of the contour change of the body (1) out of the further layer comprised of base material (10).

* * * * *